US010567003B2

(12) United States Patent
Brueggen

(10) Patent No.: US 10,567,003 B2
(45) Date of Patent: Feb. 18, 2020

(54) LIST DECODE CIRCUITS

(71) Applicant: Hewlett Packard Enterprise Development LP, Houston, TX (US)

(72) Inventor: Chris Michael Brueggen, Allen, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/416,395

(22) Filed: Jan. 26, 2017

(65) Prior Publication Data
US 2018/0212625 A1 Jul. 26, 2018

(51) Int. Cl.
*H03M 13/15* (2006.01)
*H03M 13/37* (2006.01)
*H03M 13/00* (2006.01)

(52) U.S. Cl.
CPC ....... *H03M 13/153* (2013.01); *H03M 13/154* (2013.01); *H03M 13/1515* (2013.01); *H03M 13/3746* (2013.01); *H03M 13/6508* (2013.01)

(58) Field of Classification Search
CPC ............. H03M 13/153; H03M 13/154; H03M 13/1555
See application file for complete search history.

(56) References Cited

U.S. PATENT DOCUMENTS

| | | | |
|---|---|---|---|
| 5,754,563 A | 5/1998 | White | |
| 6,347,389 B1 * | 2/2002 | Boyer | H03M 13/1515 714/784 |
| 7,028,245 B2 | 4/2006 | Zhang | |
| 7,444,582 B1 * | 10/2008 | Au | H03M 13/1515 714/780 |
| 7,793,195 B1 * | 9/2010 | Wu | H03M 13/1515 714/781 |
| 8,458,560 B2 | 6/2013 | Nichols | |
| 8,635,513 B1 | 1/2014 | Au et al. | |
| 9,166,623 B1 * | 10/2015 | Bates | H03M 13/1515 |

(Continued)

OTHER PUBLICATIONS

Ravathy, M. et al; HDL Implementation of Algebraic Soft Decision Algorithm for RS Codes; http://www.ijcsmc.com/docs/papers/April2013/V2I4201331.pdf; Apr. 2013; 10 pages.

(Continued)

*Primary Examiner* — Steve N Nguyen
(74) *Attorney, Agent, or Firm* — Hewlett Packard Enterprise Patent Department

(57) ABSTRACT

Examples disclosed herein relate to very large-scale integration (VLSI) circuit implementations of list decode circuits. In accordance with some examples disclosed herein, a list decode circuit may include a syndrome calculation circuit, a symbol erasure circuit, an erasure syndrome calculation circuit and a Berlekamp-Massey algorithm circuit (BMA), and an error locator polynomial (ELP) evaluation circuit. The syndrome calculation circuit may calculate a baseline syndrome and erasure syndrome calculation circuit may calculate erasure syndromes from error locator polynomials calculated by the symbol erasure circuit. The BMA circuit may use the calculated syndromes to generate a series of ELPs, which may be used by the ELP evaluation circuit to identify error locations in a codeword.

14 Claims, 7 Drawing Sheets

(56) References Cited

U.S. PATENT DOCUMENTS

| | | | | |
|---|---|---|---|---|
| 2003/0097632 A1* | 5/2003 | Marconetti | ....... | H03M 13/1515 |
| | | | | 714/784 |
| 2004/0177312 A1* | 9/2004 | Xin | ....... | H03M 13/15 |
| | | | | 714/782 |
| 2005/0278610 A1* | 12/2005 | Banks | ....... | H03M 13/1515 |
| | | | | 714/784 |
| 2014/0015697 A1* | 1/2014 | Wu | ....... | H03M 13/1515 |
| | | | | 341/52 |

OTHER PUBLICATIONS

Zeh A., et al; Improved Burst Error Correction via List Decoding Quasi-cyclic Codes; http://ieeexplore.ieee.org/document/7282408/; Jun. 14-19, 2015;5 pages.

* cited by examiner

LIST DECODE CIRCUITS

BACKGROUND

Reed-Solomon codes may be used to protect data in memory or storage, where the capability to correct and erase burst errors allows various kinds of device failures to be tolerated. In general, a Reed-Solomon code may allow for the correction of up to r symbol errors, based on a code distance D (i.e., τ<D/2).

Various error correction methods have been developed to allow for the correction of a larger number of symbol errors (i.e., τ≥D/2) for some percentage of error patterns. These error correction methods may be referred to as list decoding methods, because they produce a list of potential error patterns (or valid code words). Given the list of potential error patterns, it is often possible to select the most likely error pattern (or valid code word) based on higher level information.

BRIEF DESCRIPTION OF THE DRAWINGS

The following detailed description references the drawings, wherein:

FIG. 8 is an illustration of an example pipeline state diagram of a list decoding method performed by a list decode circuit.

DETAILED DESCRIPTION

Figure 1:
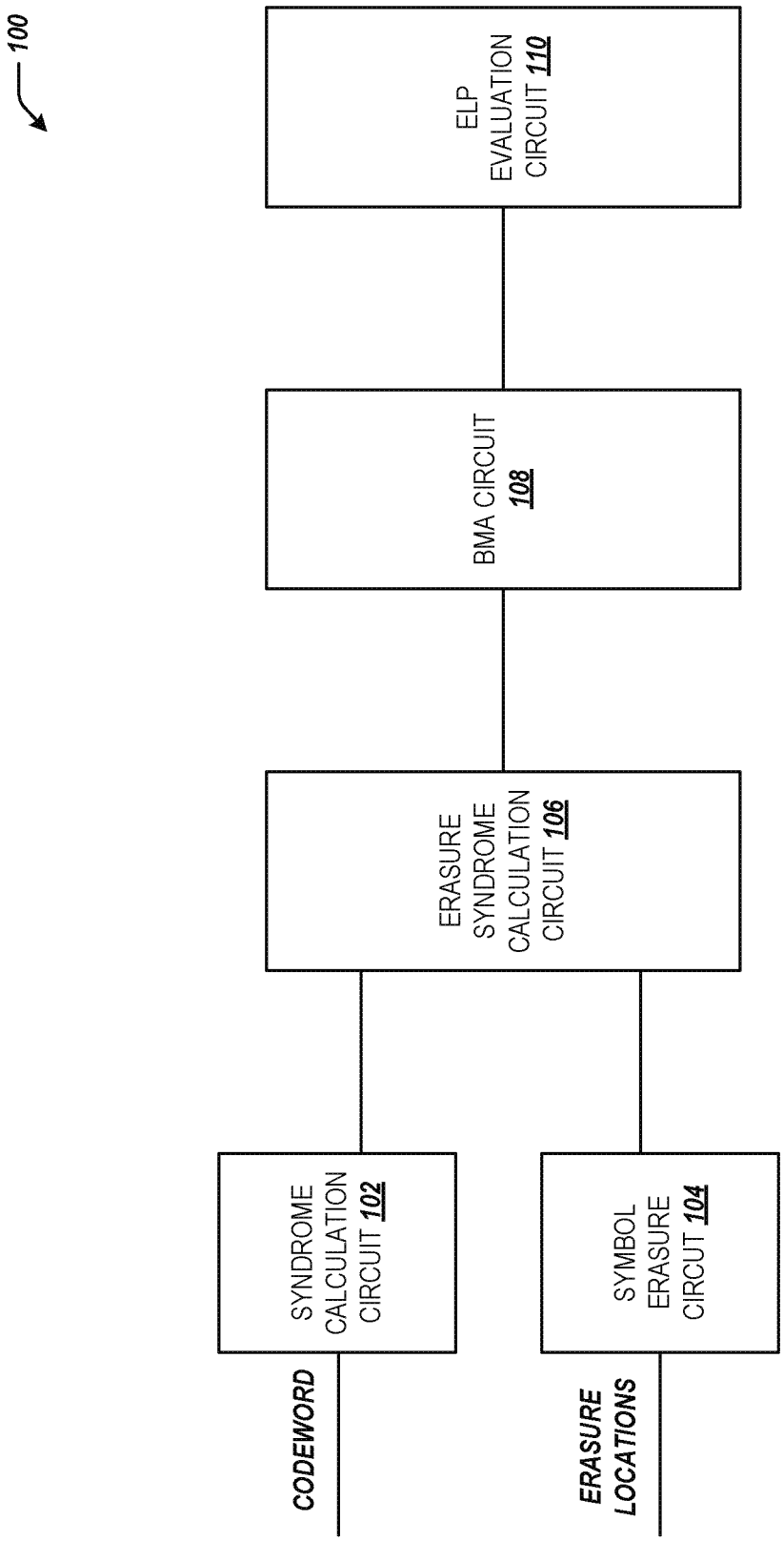
FIG. 1 is a block diagram of an example list decode circuit for list decoding.

Examples disclosed herein provide very large scale integration (VLSI) circuit implementations of list decode methods that allow for the correction of τ≥D/2 symbol errors in Reed Solomon codes when some of the errors are in a group of contiguous symbols with a particular alignment, such as those contributed by a memory device failure. In addition, the disclosed example list decoder circuit implementations are capable of detecting and correcting errors contributed by other memory devices, even in the presence of errors contributed by the failed memory device. The disclosed example list decoder circuit implementations are capable of operating in the presence of symbol erasures.

The disclosed example list decoder circuit implementations are parallelized and pipelined, thereby allowing for high throughput of trial decodes and making them suitable for use in a high-throughput error correction code (ECC) decoders. For example, a Reed-Solomon decode may include calculating a syndrome, deriving an error locator polynomial (ELP) by plugging the syndrome into iterations of a Berlekamp-Massey algorithm, factoring the resulting error locator polynomials, and determining the roots of the error locator polynomial to obtain codeword error locations. The disclosed example list decoder circuit implementations may parallelize and pipeline the execution of a plurality of computationally intensive trial decodes to reduce processing time and increase error correction throughput. Moreover, in the disclosed example implementations, trial decodes may be executed in a configurable manner, which increases overall correction capability in the case of partial device failures.

In accordance with some examples disclosed herein, a list decoder circuit may include a Berlekamp-Massey algorithm (BMA) circuit to generate a series of error locator polynomials by processing trial decodes in parallel using syndromes corresponding to symbol group erasure iterations of a codeword provided by a plurality of memory devices. The BMA circuit may be pipelined such that processing of the trial decodes are initiated on back-to-back clock cycles and processed in parallel. The trial decodes may be trial erasure decodes in that symbol groups contributed by each of the plurality of memory devices may be iteratively erased for of each trial decode. The BMA circuit may also process a trial non-erasure decode where no codeword symbols are erased. As the Berlekamp-Massey algorithm for each trial decode completes and produces an error locator polynomial, an error locator polynomial circuit may evaluate the generated error locator polynomial to identify error locations in the codeword. The error locator polynomial evaluation circuit may evaluate the error locator polynomial over a plurality of values in a finite field in parallel corresponding to possible error locations in the codeword.

Reference is now made to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the present disclosure does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

FIG. 1 is a block diagram of an example list decode circuit 100 for implementing various list decoding methods. As shown in FIG. 1, list decode circuit 100 may include various circuits and circuit components, such as a syndrome calculation circuit 102, a symbol erasure circuit 104, an erasure syndrome calculation circuit 106, a BMA circuit 108, and an ELP evaluation circuit 110. Other arrangements and numbers of components may be utilized without departing from the examples of the present disclosure.

List decode circuit 100 may be implemented by an electronic hardware device such as, for example, an application-specific integrated circuit (ASIC) device, a system-on-chip (SoC), or a field-programmable gate array (FPGA). Syndrome calculation circuit 102, symbol erasure circuit 104, erasure syndrome calculation circuit 106, BMA circuit 108, and ELP evaluation circuit 110 may be electronic and/or digital logic circuits implemented by the hardware device and may be defined in a hardware description language (HDL) such as VHDL or Verilog.

In some implementations, list decode circuit 100 may be part of a larger memory controller system. List decode circuit 100 may generally perform error detection and correction for memory devices associated with the memory controller. The memory devices may be volatile (e.g., dynamic random-access memory (RAM) (DRAM), synchronous DRAM (SDRAM), or static RAM (SRAM)) and/or non-volatile memory (e.g., memristor, resistive RAM (RRAM), or phase change RAM (PCRAM)) devices included on one or a plurality of dual in-line memory modules (DIMMs). The DIMMs may be included in a computing system having a processor (or processors) such as a server, personal computing device, or mobile computing device.

The memory controller system may read information from a group of memory devices included in the computing system. Information may be read out of the memory devices one error-correction-encoded word (referred to herein as a codeword) at a time. For a read operation, each memory device in the group may contribute a group of symbols to the codeword. For example, a group of ten memory devices may each contribute eight symbols to an 80 symbol codeword. Each symbol may include, for example, eight bits. The codewords may be encoded using error-correction codes such as Reed-Solomon codes. The codeword may include a quantity of check symbols (e.g., 15 check symbols for an 80 symbol codeword) for detecting and correcting errors in the codewords. The error-correction code distance D of the codeword may be equal to one plus the quantity of check symbols included in the codeword.

List decode circuit 100 may receive the codewords and perform error detection and correction for the received codewords. For each received codeword, syndrome calculation circuit 102 may calculate a syndrome. To calculate the syndrome of a codeword, syndrome calculation circuit 102 may compute an expected codeword and compare the expected codeword to the received codeword. If there are differences between the expected and received codewords, errors are present in the received codeword. The differences between the expected and received codewords may be collectively referred to as the syndrome of the codeword. The syndrome may be expressed as a polynomial S(x) (1).

$$S(x)=S_0+S_1x+\ldots+S_{D-2}x^{D-2} \quad (1)$$

If there are known symbol errors in the codeword, referred to as erasures, symbol erasure circuit 104 may pass the erasures to erasure syndrome calculation circuit 106, which may recompute the baseline syndrome taking the erasures into account. The syndrome (either the baseline syndrome or recomputed syndrome) may be used to find locations of the errors in the codeword. To determine the error locations in the codeword, BMA circuit 108 may compute an ELP C(x) (2) for L errors.

$$C(x)=1+C_1x+C_2x^2+\ldots+C_{L-1}x^{L-1}+C_Lx^L \quad (2)$$

The Berlekamp-Massey algorithm may determine a minimal degree of L and C(x) which results in all syndromes $S_n+C_1S_{n-1}+\ldots+C_LS_{n-L}$ being equal to 0, where L≤n≤N−1, N being the total number of syndrome coefficients which is equal to D−1.

In the Berlekamp-Massey algorithm, BMA circuit 108 may initialize L to 1 and iterate over each syndrome coefficient. Each iteration k may generate a discrepancy δ (3).

$$\delta=S_k+C_1S_{k-1}+\ldots+C_LS_{k-L} \quad (3)$$

If the discrepancy δ for iteration k is not zero, the Berlekamp-Massey algorithm may adjust C(x) according to (4) so that a recalculation of δ would be zero.

$$C(x) = C(x) - \left(\frac{\delta}{b}\right)x^m B(x) \quad (4)$$

where b is a copy of the last discrepancy δ since L was updated or initialized to 1, m is the number of iterations since L, B(x), and b were updated or initialized to 1, and B(x) is a copy of the last C(x) since L was updated or initialized to 1. The Berlekamp-Massey algorithm may continue to adjust the polynomial C(x) in subsequent iterations until the resulting discrepancy δ becomes zero.

The polynomial C(x) resulting from the final iteration of the Berlekamp-Massey algorithm may be an ELP that may be used to find the locations of L errors in the codeword, where the locations correspond to the inverse roots of the ELP. The final ELP C(x) may be used to correct up to quantity τ errors, where τ<D/2. For example, where the code distance D of the codeword is 16, BMA circuit 108 may run 15 iterations of the Berlekamp-Massey algorithm to calculate a final ELP C(x) capable of correcting up to seven symbol errors in the codeword.

In some implementations, a memory device may contribute a plurality of contiguous symbol errors to a codeword on a read from the memory device. This phenomenon may be referred to as a burst error. Burst errors may be caused by, for example, the memory device being failed or experiencing intermittent failures, or by a faulty communication bus between the memory device and memory controller. Some error-correction techniques allow for the correction of burst errors, but these techniques may not be capable of correcting random errors contributed by other memory devices and burst errors at the same time. The disclosed list decode circuits, however, are capable of correcting burst errors contributed by a memory device in combination with correcting random errors contributed by other memory devices by running multiple trial decodes in which symbol groups contributed to the codeword by each memory device may be erased. Each trial decode may include processing multiple iterations of the Berlekamp-Massey algorithm to generate an ELP.

To process trial decodes for a codeword, a plurality of syndromes may be calculated, one for each trial decode. Initially, syndrome calculation circuit 102 may calculate a baseline syndrome for the codeword, which may be computed using a power-sum calculation. Subsequently, erasure syndrome calculation circuit 106 may calculate a plurality of erasure syndromes based on the baseline syndrome and a plurality of erasure locator polynomials. Erasure syndrome calculation circuit 106 may calculate one erasure syndrome for each trial decode.

For each erasure syndrome, symbol erasure circuit 104 may erase a group of symbols contributed by a single memory device to the codeword and calculate an erasure locator polynomial Γ(x) (5) for the symbol group erasure iteration where the erasure locations are given by $j_i$.

$$\Gamma(x) = \Pi(1 - x\alpha^{j_i}) \quad (5)$$

For example, where a group of ten memory devices contribute eight symbols to a codeword, symbol erasure circuit 104 may erase the eight symbols contributed by a first memory device and compute an erasure locator polynomial for the symbol erasures of the first memory device, then symbol erasure circuit 104 may erase the eight symbols contributed by a second memory device and compute an erasure locator polynomial for symbol erasures of the second memory device, and so on until an erasure locator polynomial has been calculated for each iterative erasure of symbol groups contributed by each of the ten memory devices.

Erasure syndrome calculation circuit 106 may calculate an erasure syndrome Ξ(x) (6) for each symbol group erasure iteration based on the corresponding erasure locator polynomial Γ(x) and the baseline syndrome polynomial S(x).

$$\Xi(x) = S(x)\Gamma(x) \quad (6)$$

For example, erasure syndrome calculation circuit 106 may calculate an erasure syndrome based on the erasure locator polynomial corresponding to the symbol erasures of the first memory device, an erasure syndrome based on the erasure locator polynomial corresponding to the symbol erasures of the second memory device, and so on until an erasure syndrome has been calculated for each symbol group erasure iteration of the codeword based on the corresponding erasure locator polynomial and the baseline syndrome.

BMA circuit 108 may generate a series of ELPs using the erasure syndromes calculated by erasure syndrome calculation circuit 106. The ELPs may be generated by processing trial decodes of the codeword using the Berlekamp-Massey algorithm. In each trial decode, BMA circuit 108 may process the syndromes in the Berlekamp-Massey algorithm to generate the ELPs. Each trial decode may include processing a syndrome over a plurality of iterations of the Berlekamp-Massey algorithm.

The trial decodes may include trial erasure decodes and trial non-erasure decodes. A trial erasure decode may be a trial decode in which a symbol group contributed by a memory device to the codeword is erased. Accordingly, BMA circuit 108 may use the erasure syndromes calculated by erasure syndrome calculation circuit 106 in processing the trial erasure decodes. A trial non-erasure decode, on the other hand, may be a trial decode where no symbol groups are erased. Thus, BMA circuit 108 may use the baseline syndrome calculated by syndrome calculation circuit 102 in processing the trial non-erasure decodes.

Non-erasure decodes may be capable of correcting more symbol errors than erasure decodes because the presence of erasures in the codeword generally reduces the quantity of errors outside of the erased symbols that may be corrected. However, non-trial erasure decodes are more computationally intensive than erasure decodes, which means that erasure decodes can be performed more quickly than non-erasure decodes.

To enhance the error-correction capability of list decode 100, and to reduce the overall processing times of list decodes, BMA circuit 108 may be parallelized such that trial erasure decodes may be processed in parallel. In addition, a trial non-erasure decode may be processed in parallel with the parallelized trial erasure decodes. Moreover, the trial decodes may be pipelined such that trial decodes are initiated on back-to-back clock cycles of list decode circuit 100. For example, BMA circuit 108 may initiate a trial non-erasure decode of the codeword on a first clock cycle, may initiate a trial erasure decode of the codeword on the next clock cycle, and may initiate ones of the remaining trial erasure decodes of the codeword on each subsequent clock cycle.

BMA circuit 108 may initiate the trial non-erasure decode and trial erasure decodes such that the trial non-erasure decode completes on a clock cycle that does not interfere with the completion of the trial erasure decodes. Thus, not only does the pipelining and parallelizing of the trial decodes increase the efficiency of list decode circuit 100, but the results (i.e., the generated ELPs) from the trial decodes are outputted in close succession (i.e., either on back-to-back clock cycles or within a few clock cycles of each other), thereby minimizing the idle time of BMA circuit 108.

Moreover, the implementation of list decode circuit 100 in hardware (e.g., ASIC, SoC, or FPGA) is particularly advantageous because it allows for efficient processing of trial decodes compared to a software implementation. For example, parallelizing the trial decodes in hardware allows for the computationally intensive process of Reed-Solomon decodes to be completed very few clock cycles of the hardware whereas a software implementation would take many (i.e., thousands) clock cycles.

ELP evaluation circuit 110 may identify error locations in the codeword by evaluating each generated ELP over a plurality of values in a finite field. ELP evaluation circuit 110 may initiate evaluation of each generated ELP as it is received from BMA circuit 108 and may be parallelized such that the evaluations may continue in parallel. Each of the plurality of values in the finite field may correspond to a possible error location in the codeword.

Figure 2:
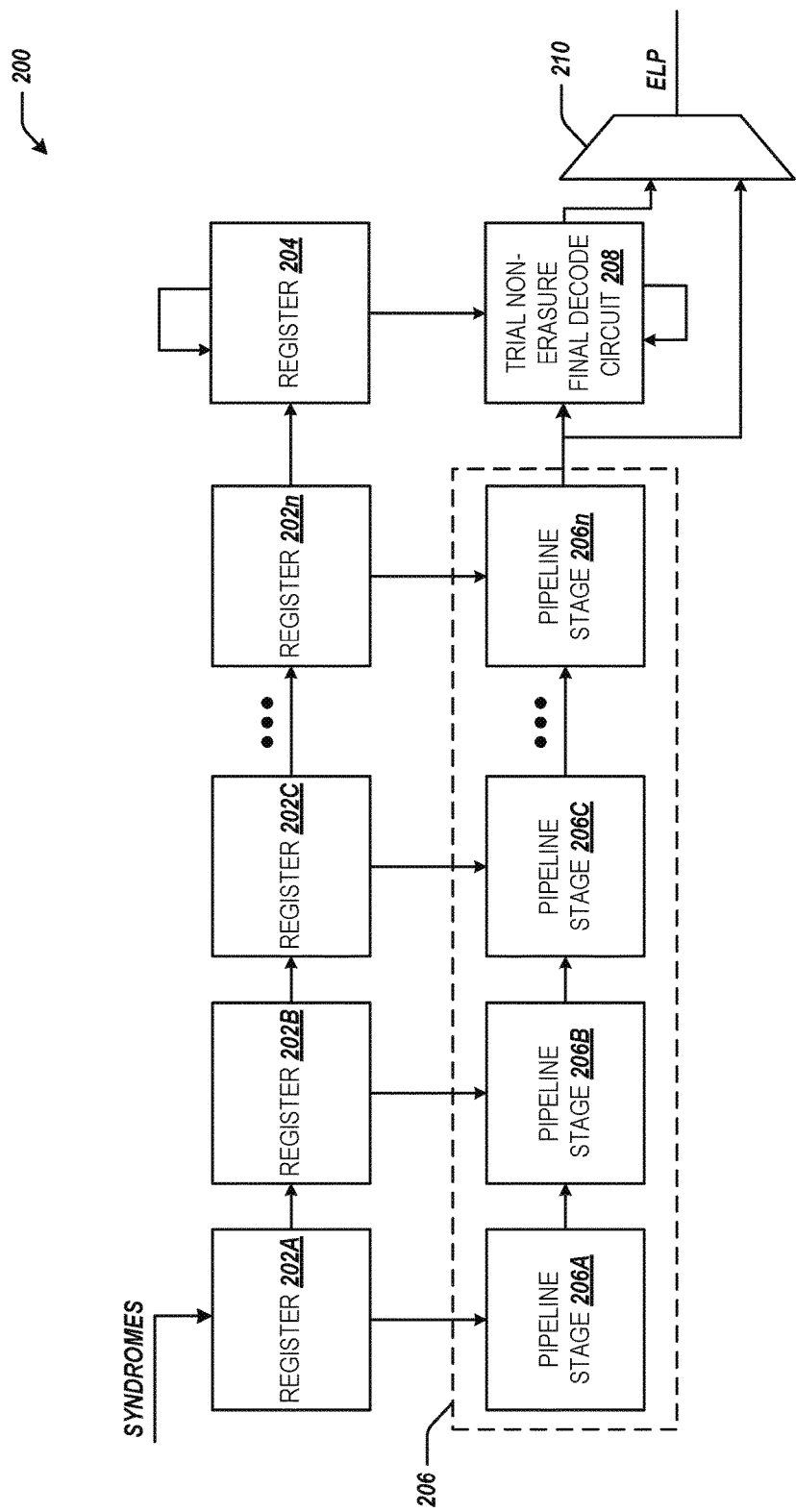
FIG. 2 is a block diagram of an example Berlekamp-Massey algorithm circuit for list decoding.

FIG. 2 is a block diagram of an example BMA circuit 200 for list decoding. BMA circuit 200 may be used to implement BMA circuit 108 of FIG. 1 and the associated functionalities described above or vice-versa. As shown in the example illustrated in FIG. 2, BMA circuit 200 may include a plurality of registers 202A-202n and register 204, a pipelined trial decode circuit 206 having a plurality of pipeline stages 206A-206n, a trial non-erasure final decode circuit 208, and a multiplexer (MUX) circuit 210. These circuits may be implemented similarly to BMA circuit 108 described above in reference to FIG. 1, generally. The number and arrangement of these components is an example only and provided for purposes of illustration. Other arrangements and numbers of components may be utilized without departing from the examples of the present disclosure.

As shown in FIG. 2, BMA circuit 200 may receive syndromes for processing a plurality of trial decodes for decoding a codeword. A baseline syndrome may be initially received and staged in register 202A. Pipeline stage 206A of trial decode circuit 206 may retrieve the baseline syndrome from register 202A and initiate a trial non-erasure decode on a first clock cycle using the baseline syndrome. Pipeline stage 206A may process the baseline syndrome in a first iteration of the Berlekamp-Massey algorithm. The trial non-erasure decode may be advanced to the next pipeline stage 206B once the first iteration of the Berlekamp-Massey algorithm has completed.

A symbol erasure circuit (e.g., symbol erasure circuit 104 of FIG. 1) may erase a symbol group contributed by a memory device to the codeword and calculate an erasure locator polynomial based on the symbol group erasure. An erasure syndrome calculation circuit (e.g., erasure syndrome calculation circuit 106 of FIG. 1) may calculate an erasure syndrome for the symbol group erasure by modifying the baseline syndrome based on the erasure locator polynomial corresponding to the symbol group erasure.

On the next clock cycle, BMA circuit 200 may receive the calculated erasure syndrome and store it in register 202A. Registers 202A-202n may be shift registers, and register 202A may shift the baseline syndrome to register 202B so that it stays aligned with the trial non-erasure decode in pipeline stage 206B of trial decode circuit 206. Pipeline stage 206A may retrieve the erasure syndrome from register 202A and initiate the trial erasure decode of the codeword to calculate an ELP corresponding to the first symbol group iteration of the codeword. Pipeline stage 206A may process the first iteration of the Berlekamp-Massey algorithm in the trial erasure decode. On the same clock cycle, pipeline stage 206B may initiate and process the second iteration of the Berlekamp-Massey algorithm in the trial non-erasure decode.

Once the iterations complete, the trial non-erasure decode may proceed to pipeline stage 206C where the next iteration of the Berlekamp-Massey algorithm for the trial non-erasure decode may be processed on the third clock cycle. The baseline syndrome corresponding to the trial non-erasure decode may be shifted to register 202C such that it stays aligned with the trial non-erasure decode. The iterations of the Berlekamp-Massey algorithm for the trial non-erasure decode may progress through the remaining pipeline stages in similar fashion to pipeline stage 206n, where the trial non-erasure decode exits the pipeline into trial non-erasure final decode circuit 208. Trial non-erasure final decode circuit 208 may continue to process the iterations of the Berlekamp-Massey algorithm in the trial non-erasure decode. The baseline syndrome may be shifted to register 204 such that it stays aligned with the trial non-erasure decode in trial non-erasure final decode circuit 208. The ELP resulting from the non-trial erasure decode may be passed to MUX circuit 210, which may provide the ELP to an ELP evaluation circuit (e.g., ELP evaluation circuit 110 of FIG. 1).

BMA circuit 200 may initiate subsequent trial erasure decodes on back-to-back clock cycles in similar fashion to the first trial erasure decode. Subsequent erasure syndromes may be calculated based on symbol group iterations of the codeword and stored in register 202A initially. The erasure syndromes may be shifted through registers 202A-202n such that they stay aligned with their corresponding trial erasure decode. Each trial erasure decode may be processed through pipeline stages 206A-206n until the resulting ELPs are passed to MUX circuit 210, which may provide the ELPs to an ELP evaluation circuit.

Figure 3:
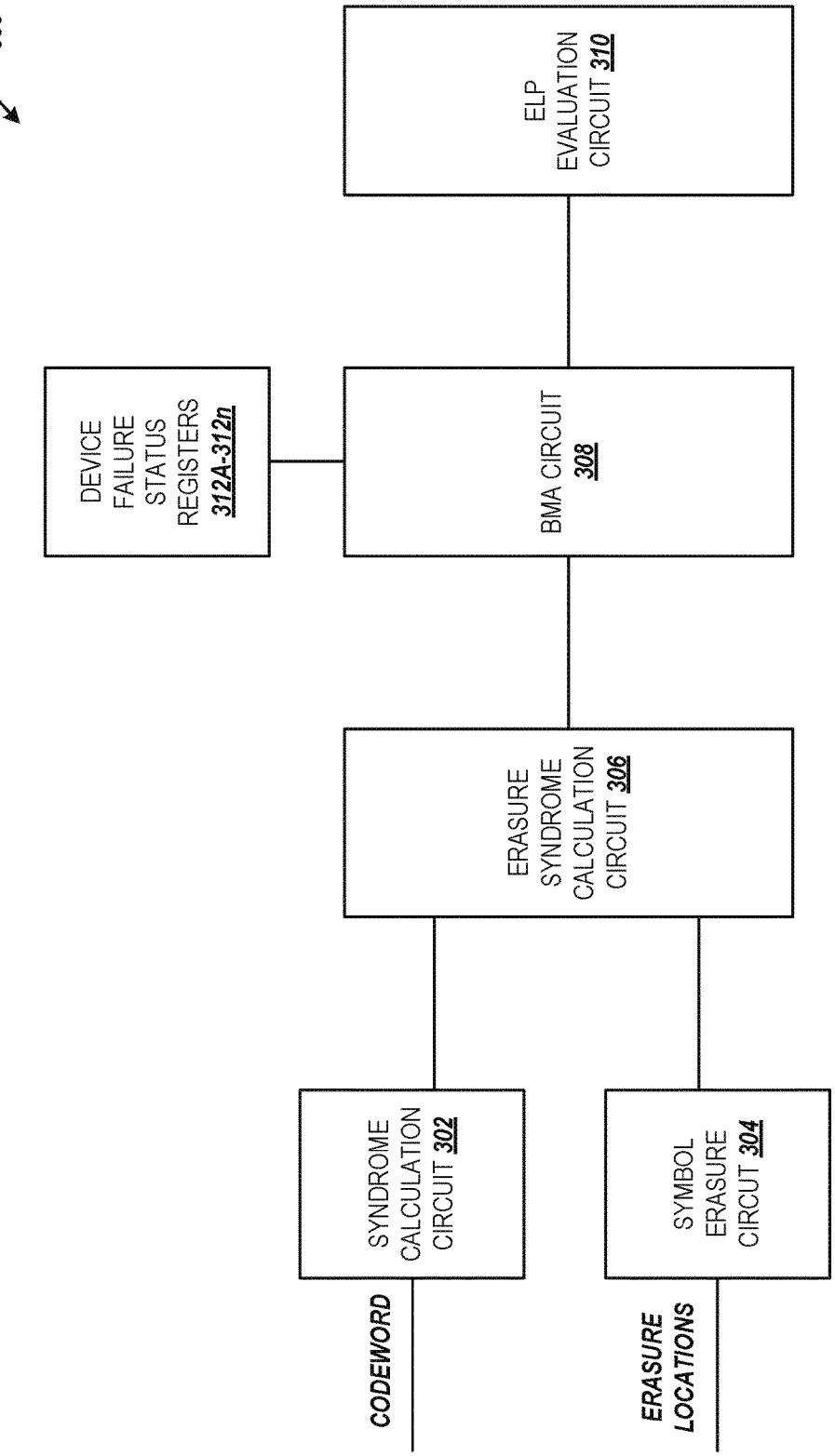
FIG. 3 is a block diagram of an example list decode circuit for list decoding.

FIG. 3 is a block diagram of an example list decode circuit 300 for implementing various list decoding methods. List decode circuit 300 may be implemented by hardware similar to list decode circuit 100 and may include electrical and/or logic circuits similar to those included in list decode circuit 100, such as a syndrome calculation circuit 302, a symbol erasure circuit 304, an erasure syndrome calculation circuit 306, a BMA circuit 308, and an ELP evaluation circuit 310. In addition, list decode circuit 300 may include status registers 312A-312n. Other arrangements and numbers of components may be utilized without departing from the examples of the present disclosure. In some implementations, BMA circuit 308 may be implemented by BMA circuit 200 of FIG. 2.

Status registers 312A-312n may store a device status for each of the plurality of memory devices contributing symbols to codewords decoded by list decode circuit 300. The device status for each memory device may indicate whether the memory device is healthy and operating normally or whether it is known to be exhibiting failures. If a memory device is known to be exhibiting failures, its device status may further reflect a level of failure. For example, a memory device may be assigned a device status that reflects a level of failure according to its error rate (i.e., the quantity or rate of errors the memory device experiences on reads from the memory device). An error rate may be assigned to a memory device based on different threshold error rates. For example, a memory device may be identified to be hard failed if it is producing burst errors on a percentage of reads from the memory device above a first threshold percentage (e.g., approximately 90%). As another example, a memory device may be identified to be firm failed if it is producing burst errors on a percentage of reads from the memory device less than the first threshold percentage but greater than a second threshold percentage (e.g., approximately 50%). As a further example, a memory device may be identified to be soft failed if it is producing burst errors on a percentage of reads less than the first and second threshold percentages but greater than a third threshold percentage (e.g., approximately 10%).

BMA circuit 308 may retrieve the device statuses of memory devices contributing symbols to a codeword and may coordinate and modify the scheduling of trial decodes based on the retrieved device statuses. For example, BMA circuit 308 may, in response to determining that a memory device among a plurality of memory devices contributing symbols to a codeword is known to be hard failed (i.e., based on its status in status registers 312A-312n), forego initiating the trial non-erasure decode and the trial erasure decodes for the non-failed memory devices and may only initiate and process a trial erasure decode in which the symbol group contributed by the failed memory device is erased. As another example, in response to determining that a memory device among the plurality of memory devices contributing symbols to the codeword is known to be firm failed, BMA circuit 308 may initiate a trial non-erasure decode for the codeword and a trial erasure decode in which the symbol group contributed by the failed memory device is erased, and may process the trial decodes in parallel. As a further example, in response to determining that a memory device among the plurality of memory devices contributing symbols to the codeword is known to be soft failed, or if no memory device is indicated as failed, BMA circuit 308 may initiate a trial non-erasure decode and a full set of trial erasure decodes and process the decodes in parallel.

FIGS. 4-7 are illustrations of example trial decode flows for list decoding. The example trial decode flows illustrated in FIGS. 4-7 may be performed by a BMA circuit such as, for example, BMA circuit 108 of FIG. 1, BMA circuit 200 of FIG. 2, and BMA circuit 308 of FIG. 3. As shown in FIGS. 4-7, the example trial decode flows may include various quantities and types of trial decodes. These quantities and types are shown for the sake of simplification in the example illustrations and are not meant to be limiting. Indeed, other quantities and types of trial decodes may be used without departing from the examples of the present disclosure.

Figure 4:
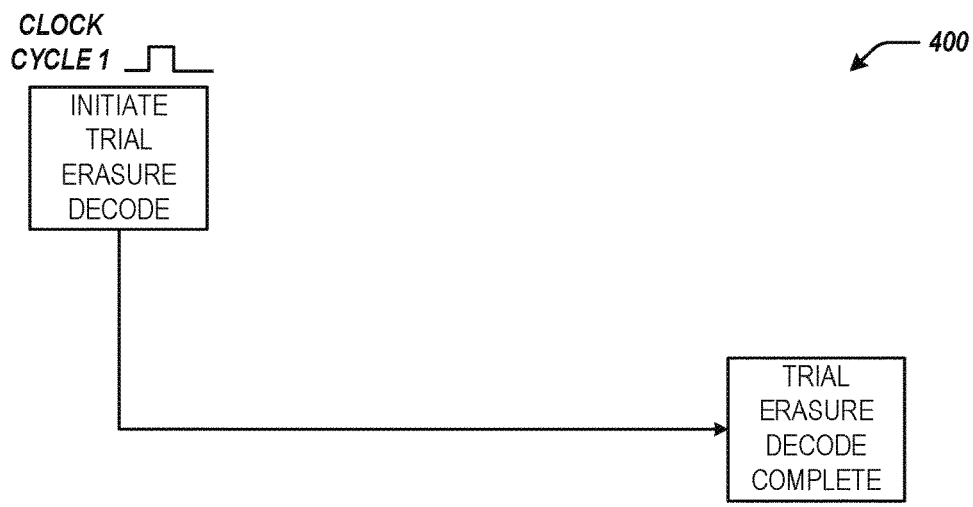
FIG. 4 is an illustration of an example flow of a list decoding method performed by a list decode circuit.

Example trial decode flow 400 illustrated in FIG. 4 may be an example trial decode flow where a memory device among a plurality of memory devices contributing symbols to a codeword is known to be hard failed. The BMA circuit may determine that the memory device is hard failed by determining the device status of the memory device in a status register. The status register may indicate, for example, that the memory device is exhibiting a hard failure (i.e., a failure on nearly every read from the memory device).

As shown in FIG. 4, the BMA circuit may initiate the trial erasure decode for the hard failed memory device on clock cycle 1. To process the trial erasure decode for the known failed memory device, the BMA circuit may generate an ELP by processing iterations of the Berlekamp-Massey algorithm using a syndrome calculated for the codeword after a group of symbols contributed by the hard failed memory device has been erased from the codeword. The trial erasure decode for the hard failed memory device may complete on a clock cycle subsequent to clock cycle 1. Each iteration of the Berlekamp-Massey algorithm for the trial erasure decode may complete in a single clock cycle and the next iteration may begin on the next clock cycle until the processing of the syndrome in the algorithm is complete.

Figure 5:
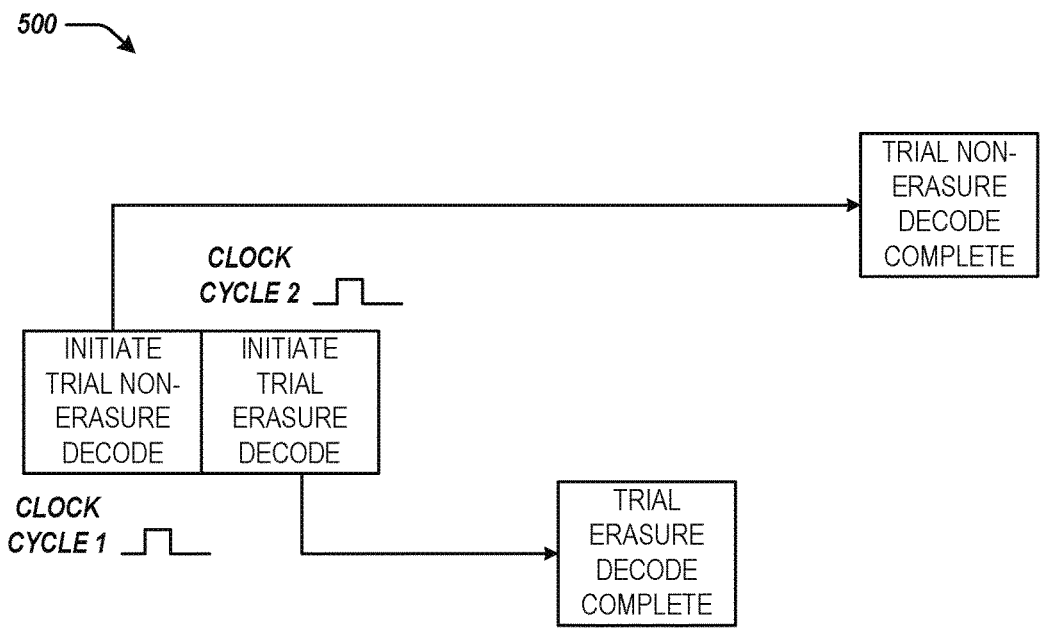
FIG. 5 is an illustration of an example flow of a list decoding method performed by a list decode circuit.

Example trial decode flow 500 illustrated in FIG. 5 may be an example trial decode flow where a memory device among a plurality of memory devices contributing symbols to a codeword is identified to be firm failed. The BMA circuit may determine that the memory device is firm failed by determining the device status of the memory device in a status register. The status register may indicate, for example, that the memory device is exhibiting burst errors on a percentage of reads from the memory device (e.g., approximately 50% of reads from the memory device).

As shown in FIG. 5, the BMA circuit may initiate a trial non-erasure decode on clock cycle 1 and a trial erasure decode for the firm failed memory device on the next clock cycle (i.e., clock cycle 2). The BMA circuit may initiate the trial non-erasure decode along with the trial erasure decode for the failed failed memory device to ensure that, if the suspected failed memory device does not contribute a burst error to the codeword on the particular read, the BMA circuit is still capable of producing an ELP that is capable of correcting error patterns that are not indicative of the firm failed memory device contributing a burst error. The trial erasure decode for the suspected failed memory device may complete on a clock cycle prior to the trial non-erasure decode because the trial erasure decode may be completed in less processing time. The trial erasure decode may complete in less processing time because the trial non-erasure decode may process more iterations of the Berlekamp-Massey algorithm than the trial erasure decode.

Figure 6:
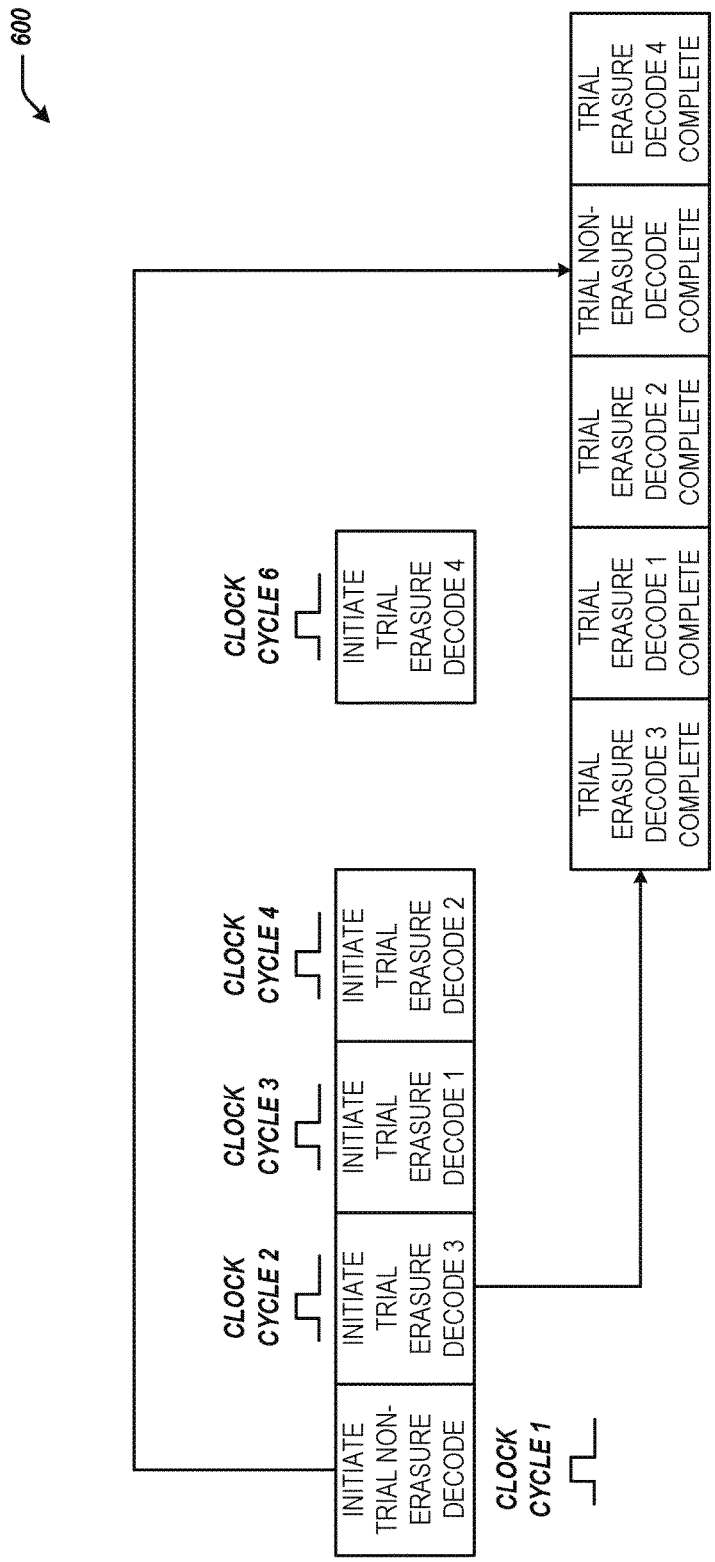
FIG. 6 is an illustration of an example flow of a list decoding method performed by a list decode circuit.

Example trial decode flow 600 illustrated in FIG. 6 may be an example trial decode flow where a memory device among a plurality of memory devices contributing symbols to a codeword is identified as being soft failed. The BMA circuit may generate ELPs by processing a trial non-erasure decode and a plurality of trial erasure decodes in parallel.

As shown in FIG. 6, the BMA circuit may prioritize the initiation of the trial decode for the soft failed memory device (trial erasure decode 3) over the other memory devices. The trial non-erasure decode may be initiated first on clock cycle 1 followed by a trial erasure decode 3 on the next clock cycle (i.e., clock cycle 2). Subsequent trial erasure decodes (i.e., trial erasure decode 2 and 3) for the erasure syndromes associated with symbol group erasures for the other memory devices may be initiated on one of the next two clock cycles (i.e., clock cycles 3 and 4, respectively).

At clock cycle 5, the BMA circuit may inject a gap in the trial decode processing to allow for efficient timing of trial decode completion. That is, the BMA circuit may know on which clock cycle the trial non-erasure decode is to complete and may leave a gap in trial decode processing such that the trial non-erasure decode completes on an idle clock cycle between the completion of trial erasure decodes. The BMA circuit may continue to initiate the remaining trial erasure decodes (i.e., trial erasure decode 4 and others) on subsequent clock cycles (i.e., clock cycle 6 and subsequent) until all of the remaining clock cycles are initiated.

The trial decode for the soft failed memory device (trial erasure decode 3) and the BMA circuit may provide the ELP resulting from the trial decode to an ELP evaluation circuit (e.g., ELP evaluation circuit 110 of FIG. 1, ELP evaluation circuit 310 of FIG. 3, etc.). The ELP evaluation circuit may evaluate the ELP to determine if the resulting error pattern has errors in the data from the "soft" failed memory device and no errors anywhere else. If so, it is considered very likely to be the actual error pattern and the BMA circuit may terminate the other trial decodes.

Figure 7:
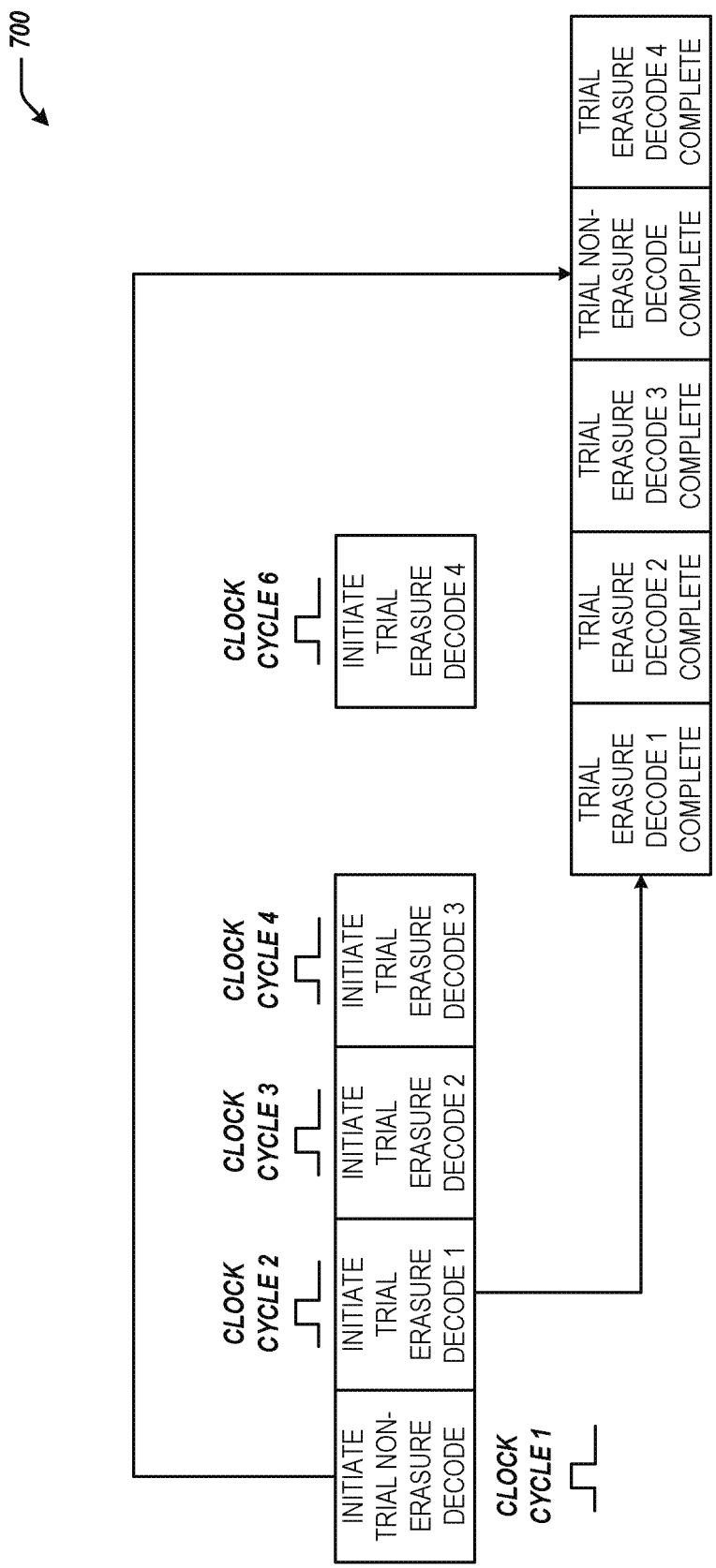
FIG. 7 is an illustration of an example flow of a list decoding method performed by a list decode circuit.

Example trial decode flow 700 illustrated in FIG. 7 may be an example trial decode flow where no memory device among a plurality of memory devices contributing symbols to a codeword is identified as being failed. The BMA circuit may generate ELPs by processing a trial non-erasure decode and a plurality of trial erasure decodes in parallel. However, instead of prioritizing one trial erasure decode over the others, the trial erasure decodes may be issued to the processing pipeline in the order in which their syndromes are generated.

Figure 8:
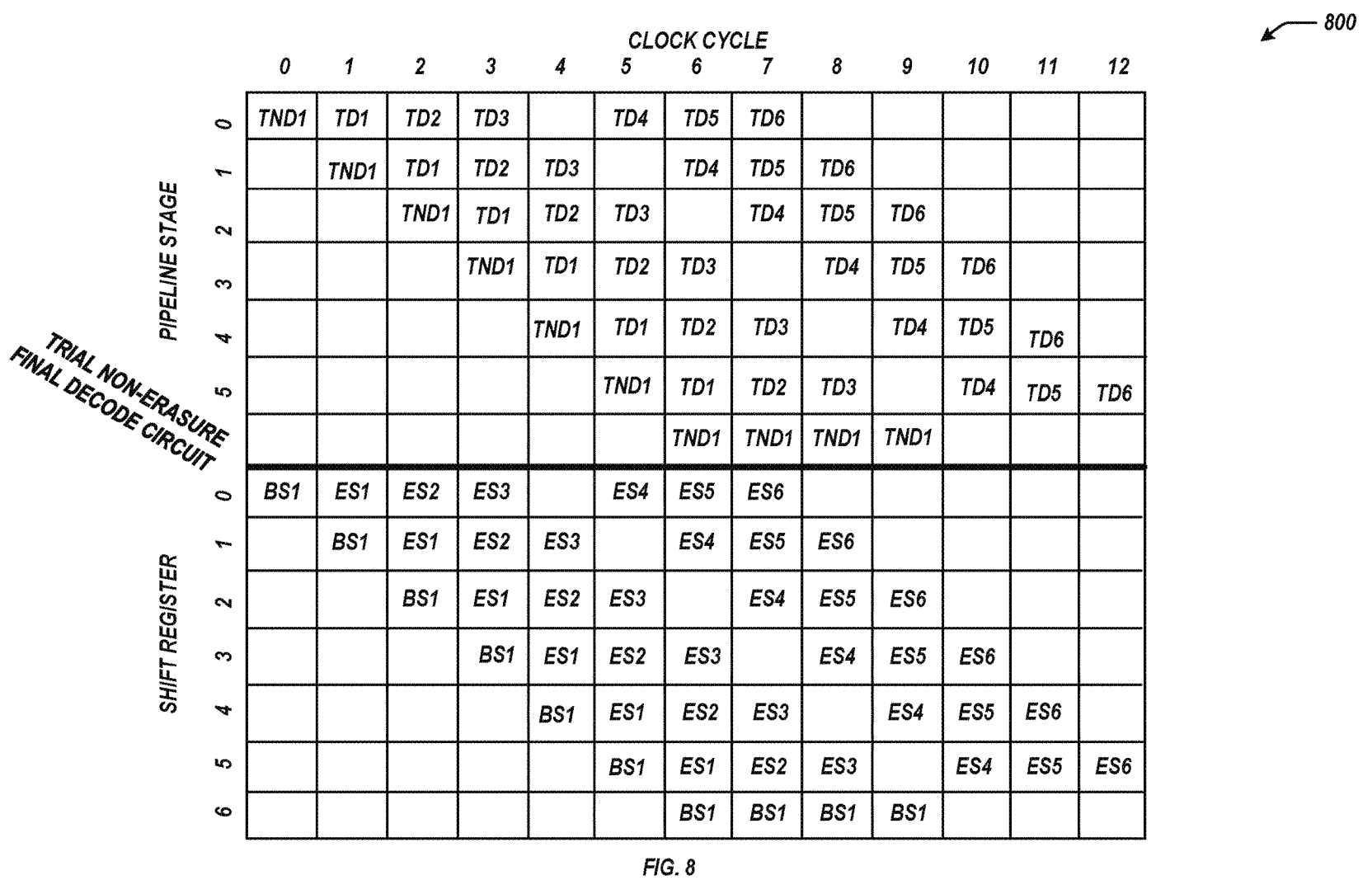

FIG. 8 is an illustration of example trial decode pipeline state diagram 800 for an example method of list decoding. Example pipeline state diagram 800 illustrated in FIG. 8 may be performed by a BMA circuit such as, for example, BMA circuit 108 of FIG. 1, BMA circuit 200 of FIG. 2, and BMA circuit 308 of FIG. 3. As shown in FIG. 8, example pipeline state diagram 800 may include various quantities of clock cycles, pipeline stages, shift registers, trial non-erasure decodes, trial erasure decodes, baseline syndromes, and erasure syndromes. These quantities are shown for the sake of simplification in the example illustrations and are not meant to be limiting. Indeed, other quantities may be used without departing from the examples of the present disclosure.

Example pipeline state diagram 800 illustrates an example flow of the processing of a trial non-erasure decode (TND1) and its corresponding baseline syndrome (BS1) along with the processing of a plurality of trial erasure decodes (TD1-TD6) and their corresponding erasure syndromes (ES1-ES6). Example pipeline state diagram 800 may illustrate the flow of trial decodes when no memory device contributing symbols to the codeword being decoded is known to be failed.

As shown in FIG. 8, pipeline state diagram 800 may start in clock cycle 0, where the trial non-erasure decode TND1 is initiated. Its corresponding baseline syndrome may be aligned to pipeline stage 0 (e.g., pipeline stage 206A of trial decode circuit 206 in FIG. 2) in shift register 0 (e.g., shift register 202A of FIG. 2) such that pipeline stage 0 may retrieve it. The first iteration of the BMA in TND1 may be processed in clock cycle 0.

In clock cycle 1, the second iteration of the BMA in TND1 may be processed in pipeline stage 1, and BS1 may be shifted to shift register 1 such that it is aligned with pipeline stage 1. Also in clock cycle 1, a first erasure syndrome ES1 may be aligned to pipeline stage 0 of the trial decode circuit in shift register 0, and the trial decode circuit may initiate the processing of a first trial erasure decode TD1 in pipeline stage 0 and may retrieve ES1 from shift register 0. The trial decode circuit may process a first iteration of the BMA in TD 1 in pipeline stage 0 in clock cycle 1.

In clock cycle 2, the third iteration of the BMA in TND1 may be processed in pipeline stage 2, and BS1 may be shifted to shift register 2 such that it stays aligned with TND1. Also in clock cycle 2, TD1 may be shifted to pipeline stage 1, and the second iteration of the BMA in TD 1 may be processed. ES1 may be shifted to shift register 1 so that it says aligned with ES1 in pipeline stage 1. Further in clock cycle 2, a second erasure syndrome ES2 may be aligned to pipeline stage 0 of the trial decode circuit in shift register 0, and the trial decode circuit may initiate the processing of a second trial erasure decode TD2 in pipeline stage 0 and may retrieve ES2 from shift register 0. The trial erasure decode circuit may process a first iteration of the BMA in TD 2 in pipeline stage 0 in clock cycle 2.

After TND1 has been processed in pipeline stage 5, TND1 may be passed to a trial non-erasure final decode circuit (e.g., trial non-erasure final decode circuit 208 of FIG. 2) where any remaining iterations of the Berlekamp-Massey algorithm may be processed while the pipeline of the trial decode circuit continues to process trial erasure decodes. The trial erasure decodes may be processed through pipeline stage 5, at which point the resulting ELPs may be passed to an ELP evaluation circuit (e.g., ELP evaluation circuit 110 of FIG. 1, ELP evaluation circuit 310 of FIG. 3, etc.) via a MUX circuit (e.g., MUX circuit 210 of FIG. 2).

As shown in FIG. 8, the trial non-erasure decode and trial erasure decodes may continue to process in parallel until all of the trial decodes are complete. in clock cycle 4, a gap may be injected into the processing of trial erasure decodes to ensure that there is a free slot at the end of the pipeline. The free slot is aligned with the completion of the processing of the trial non-erasure decode so that the ELP generated from the trial non-erasure decode may be immediately selected by the MUX circuit and passed to the ELP evaluation circuit. Since the processing time of the trial non-erasure decode may be predictable, it is possible to determine which clock cycle in which the gap should be injected.

The foregoing disclosure describes a number of example implementations for list decode circuits. For purposes of explanation, certain examples are described with reference to the components illustrated in FIGS. 1-8. The functionality of the illustrated components may overlap, however, and may be present in a fewer or greater number of elements and components. Further, all or part of the functionality of illustrated elements may co-exist or be distributed among several geographically dispersed locations.

Further, the sequence of operations described in connection with FIGS. 4-8 are examples and is not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A list decode circuit, comprising:
a syndrome calculation circuit to calculate a baseline syndrome for a codeword provided by a plurality of memory devices;
a symbol erasure circuit to, for each of the plurality of memory devices:
generate a symbol group erasure iteration of the codeword by erasing a symbol group contributed by the memory device to the codeword; and
calculate erasure locator polynomials for the symbol group erasure iteration of the codeword;
an erasure syndrome calculation circuit to calculate erasure syndromes for each symbol group erasure iteration of the codeword based on the corresponding erasure locator polynomial and the baseline syndrome;
a Berlekamp-Massey algorithm (BMA) circuit to generate a series of error locator polynomials (ELPs) by processing trial decodes of each symbol group erasure iteration of the codeword in parallel using erasure syndromes corresponding to the symbol group erasure iterations of the codeword, the BMA circuit being pipelined such that trial decodes are initiated on back-to-back clock cycles; and
an ELP evaluation circuit to identify error locations in the codeword by evaluating each generated ELP over a plurality of values in a finite field in parallel, each of the plurality of values corresponding to a possible error location in the codeword.

2. The list decode circuit of claim 1, wherein the syndrome recalculation circuit is to recalculate the baseline syndrome based on erasure locations in the codeword known prior to the BMA circuit initiating processing of the trial decodes.

3. The list decode circuit of claim 1, the BMA circuit comprising:
a plurality of pipeline stages, each of the plurality of pipeline stages to process an iteration of a BMA in each of the trial decodes, wherein each of the plurality of pipeline stages is to, on a same clock cycle, initiate an iteration of a BMA in one of the trial decodes.

4. The list decode circuit of claim 3, the BMA circuit comprising:
a plurality of registers to store the erasure syndromes;
wherein each of the plurality of pipeline stages is to retrieve an erasure syndrome corresponding to the trial decode it is processing.

5. The list decode circuit of claim 1, wherein the BMA circuit is to:
in response to determining that a memory device among a plurality of memory devices contributing symbols to a codeword is hard failed, generate an ELP by processing only a trial erasure decode using the erasure syndrome calculated for the symbol group erasure iteration of the codeword generated by erasing the group of symbols contributed by the hard failed memory device.

6. The list decode circuit of claim 1, wherein:
the trial decodes are trial erasure decodes; and
the BMA circuit is to process a trial non-erasure decode of the codeword in parallel with the trial erasure decodes.

7. The list decode circuit of claim 6, wherein the BMA circuit is to initiate processing of the trial non-erasure decode before initiating processing of the trial erasure decodes.

8. The list decode circuit of claim 6, wherein the BMA circuit is to process the trial non-erasure decode of the codeword based on the baseline syndrome.

9. A list decode circuit, comprising:
- a syndrome calculation circuit to calculate a baseline syndrome for a codeword provided by a plurality of memory devices;
- a symbol erasure circuit to, for each of the plurality of memory devices:
  - generate a symbol group erasure iteration of the codeword by erasing a symbol group contributed by the memory device to the codeword; and
  - calculate erasure locator polynomials for the symbol group erasure iteration of the codeword;
- an erasure syndrome calculation circuit to calculate erasure syndromes for each symbol group erasure iteration of the codeword based on the corresponding erasure locator polynomial and the baseline syndrome;
- a Berlekamp-Massey algorithm (BMA) circuit to generate a series of error locator polynomials (ELPs) by processing a trial non-erasure decode and trial erasure decodes of each symbol group erasure iteration of the codeword in parallel, the BMA circuit to initiate processing of the trial non-erasure decode before initiating the trial erasure decodes, the BMA circuit being pipelined such that the trial erasure decodes are initiated on back-to-back clock cycles; and
- an ELP evaluation circuit to identify error locations in the codeword by evaluating each generated ELP over a plurality of values in a finite field in parallel, each of the plurality of values corresponding to a possible error location in the codeword.

10. The list decode circuit of claim 9, comprising:
- a plurality of registers to store a device failure status for each of the plurality of memory devices.

11. The list decode circuit of claim 10, wherein the plurality of registers are shift registers.

12. The list decode circuit of claim 9, wherein the BMA circuit is to:
- in response to determining that a memory device among a plurality of memory devices contributing symbols to a codeword is firm failed, generate the series of ELPs by processing the trial non-erasure decode and only a single trial erasure decode using the erasure syndrome calculated for the symbol group erasure iteration of the codeword generated by erasing the group of symbols contributed by the firm failed memory device.

13. The list decode circuit of claim 9, wherein the BMA circuit is to:
- in response to determining that a memory device among the plurality of memory devices contributing symbols to the codeword is soft failed, generate the series of ELP by processing the trial non-erasure decode and a plurality of trial erasure decodes in parallel.

14. The list decode circuit of claim 9, wherein the BMA circuit is to generate the ELP by:
- generating a first candidate ELP by processing the trial non-erasure decode; and
- generating a series of additional candidate ELPs by processing the trial erasure decodes of each symbol group erasure iteration of the codeword.

* * * * *